United States Patent
Schat

(10) Patent No.: US 11,146,252 B2
(45) Date of Patent: Oct. 12, 2021

(54) LOGIC AND FLIP-FLOP CIRCUIT TIMING MARGINS CONTROLLED BASED ON SCAN-PATTERN TRANSITION PROCESSING

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 69 days.

(21) Appl. No.: 16/799,053

(22) Filed: Feb. 24, 2020

(65) Prior Publication Data

US 2021/0265986 A1    Aug. 26, 2021

(51) Int. Cl.
  *H03K 3/037*    (2006.01)
  *G01R 31/28*    (2006.01)
  *G01R 31/00*    (2006.01)

(52) U.S. Cl.
  CPC ....... *H03K 3/0375* (2013.01); *G01R 31/2882* (2013.01); *G01R 31/00* (2013.01)

(58) Field of Classification Search
  CPC .......................... G01R 31/2882; H03K 3/0375
  See application file for complete search history.

(56) References Cited

U.S. PATENT DOCUMENTS

| | | |
|---|---|---|
| 9,214,924 B2 | 12/2015 | Priel et al. |
| 10,320,387 B1 | 6/2019 | Ribeiro Do Nascimento et al. |
| 10,372,868 B2 * | 8/2019 | Huang .................... G06F 30/30 |
| 10,396,790 B1 | 8/2019 | Junqueira De Andrade et al. |
| 10,782,346 B2 * | 9/2020 | Flores .................. H03K 3/0375 |

FOREIGN PATENT DOCUMENTS

EP    3012975 B1    7/2019

OTHER PUBLICATIONS

Countering the effects of Silicon Aging on SRAM PUFs; Roel Maes, Vincent van der Leest, 2014 IEEE International Symposium on Hardware-Oriented Security and Trust (HOST), p. 148-153.
In-situ and in-field technique for monitoring and decelerating NBTI in 6T-SRAM Register Files; Teng Yang, Doyun Kim, Jiangyi Li, Peter R. Kinget, Mingoo Seok, Transactions on Very Large Scale Integration (VLSI) Systems, vol. 26, No. 11, Nov. 2018, p. 2241-2253.
The influence of Clock Gating on NBTI-induced delay degradation; J. Pachito, C. V. Martins, J. Semião, M. Santos, I. C. Teixeira, J. P. Teixeira; 2012 IEEE 18th International On-Line Testing Symposium (IOLTS).

(Continued)

*Primary Examiner* — Patrick O Neill

(57) ABSTRACT

One specific example involves an integrated circuit that has application logic circuitry which includes flip-flop circuits susceptible to degradations of setup and hold times relative to specified minimum setup and hold times for signals to be processed by the respective flip-flop circuits. In a method carried out by the integrated circuit, timing-based logic states of the flip-flop circuits are controlled, based on at least one transition-scan pattern processed by the flip-flop circuits as part of the application logic circuitry; and respective logic states are set for those flip-flops, which due to degradations of the actual setup and hold times do not satisfy anymore the originally specified minimum setup and hold times.

20 Claims, 5 Drawing Sheets

(56) References Cited

OTHER PUBLICATIONS

Skew management of NBTI impacted gated clock trees, Ashutosh Chakraborty, David Z. Pan; IEEE Transactions on Computer-Aided Design of Integrated Circuits and Systems 2013 vol. 32, Issue: 6, p. 918-927.

Comparative analysis of NBTI effects on low power and high performance flip-flops, K. Ramakrishnan, X. Wu, N. Vijaykrishnan, Y. Xie; 2008 IEEE International Conference on Computer Design, p. 200-205.

Analyzing BTI Effects on Retention Registers; Yao-Te Wang, Ing-Chao Lin, 2012 IEEE 4th Asia Symposium on Quality Electronic Design, p. 71-77.

Design for Reliability: A Duty-Cycle Management System for Timing Violations; Soonyoung Cha, Dae-Hyun Kim, Taizhi Liu, and Linda Milor, 2016 Conference on Design of Circuits and Integrated Systems (DCIS).

An equivalent circuit model for the recovery component of BTI; J. Martin-Martinez, R. Rodriguez, M. Nafria, X. Aymerich, B. Kaczer, G. Groeseneken, ESSDERC 2008—38th European Solid-State Device Research Conference, p. 55-58.

The Impact of NBTI on the Performance of Combinational and Sequential Circuits; Wenping Wang, Shengqi Yang, Sarvesh Bhardwaj, Rakesh Vattikonda, Sarma Vrudhula, Frank Liu, Yu Cao; 2007 44th ACM/IEEE Design Automation Conference, p. 364-369.

* cited by examiner

LOGIC AND FLIP-FLOP CIRCUIT TIMING MARGINS CONTROLLED BASED ON SCAN-PATTERN TRANSITION PROCESSING

Aspects of various embodiments are directed to apparatuses and methods involving or including integrated circuits (ICs) with logic/flip-flop circuitry having signal-processing timing requirements that may change undesirably over time to an extent that operation of the ICs may fall in need of repair.

Many ICs having logic circuitry such as computer processors that operate via a generation of a circuit providing a clock signal transitioning in the Giga Hertz (GHz) frequency range as may be appropriate for the signal processing applications implemented by the IC's logic/flip-flop circuitry. At such high clock rates, oftentimes the manufacturers/designers of this circuitry specify relative tight clocking margins for each such flip-flop, such that the data input has to be stable for a minimum time before the clock edge (setup time) until a minimum time after the clock edge (hold time).

In many small-process applications, shifting of threshold voltages due to Bias Temperature Instability (BTI) may present aging issues and in many instances, may present the dominant mechanism associated with aging and/or errors in circuit operation. These BTI-related issues may affect the propagation delay both in data and clock paths of the circuitry and often to different extents. In certain circuit environments, BTI can hence advance and/or delay the data edges relative to the clock edges at the inputs of a flip-flop, and this may be dependent on the length of the data and clock paths. Further, BTI can also impact the timing behavior of the flip-flops themselves including but not limited to the above-noted modifications of the minimum setup and hold times required for the circuits.

These and other matters have presented challenges to the manufacture, configuration, and the ongoing use and maintenance of integrated circuits (ICs) having such logic/flip-flop circuitry, in a variety of different applications.

SUMMARY

Various example embodiments are directed to issues such as those addressed above and/or others which may become apparent from the following disclosure, and in some instances involve integrated circuits in which application logic circuitry includes flip-flops which are susceptible to degradations of setup and hold times (whether due to aging, excessive use, etc.).

One specific example is directed to such an integrated circuit in which this susceptibility of the flip-flop circuits may be a concern relative to specified minimum setup and hold times for signals to be processed by the respective flip-flop circuits. In a method carried out by the integrated circuit (e.g., "on-chip"), timing-based logic states of the flip-flop circuits are controlled based on at least one transition-scan pattern processed by the flip-flop circuits as part of the application logic circuitry; and respective logic states of the flip-flop circuits are set for those flip-flops for which degradations of the actual setup and hold times do not satisfy the originally specified minimum setup and hold times.

In more specific examples directed to the above apparatuses, the control logic is configured to assess whether to set respective ones of the flip-flop circuits to the opposing one of two logic states, as a constant logic state, during times when the flip-flop circuits are inactive, and/or to assess whether historically respective ones of the flip-flop circuits are likely to have been set predominantly in one of the two logic states and, in response, to set said respective ones of the flip-flop circuits to the other one of the two logic states, as a constant logic state, during times when the flip-flop circuits are inactive.

Relating to the above aspects, other specific examples are directed to apparatuses in which flip-flop circuits are susceptible to (e.g., age-based) degradations of setup and hold times relative to minimum setup and hold times for signals (e.g., as specified by the circuit manufacturers). As such aspects and actions may be carried out on chip, these specific examples are further directed to these apparatuses including the application logic circuitry, such flip-flop circuits, and further including control circuitry to control related to the timing/margins of the logic states associated with the minimum setup and hold times of the flip-flop circuits. In this regard, the control circuitry may control timing-based logic states of the flip-flop circuits based on at least one transition-scan pattern processed by the flip-flop circuits as part of the application logic circuitry, and may also set respective logic states of the flip-flop circuits for which the degradations of the actual setup and hold times do not satisfy the originally specified minimum setup and hold times.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1A:
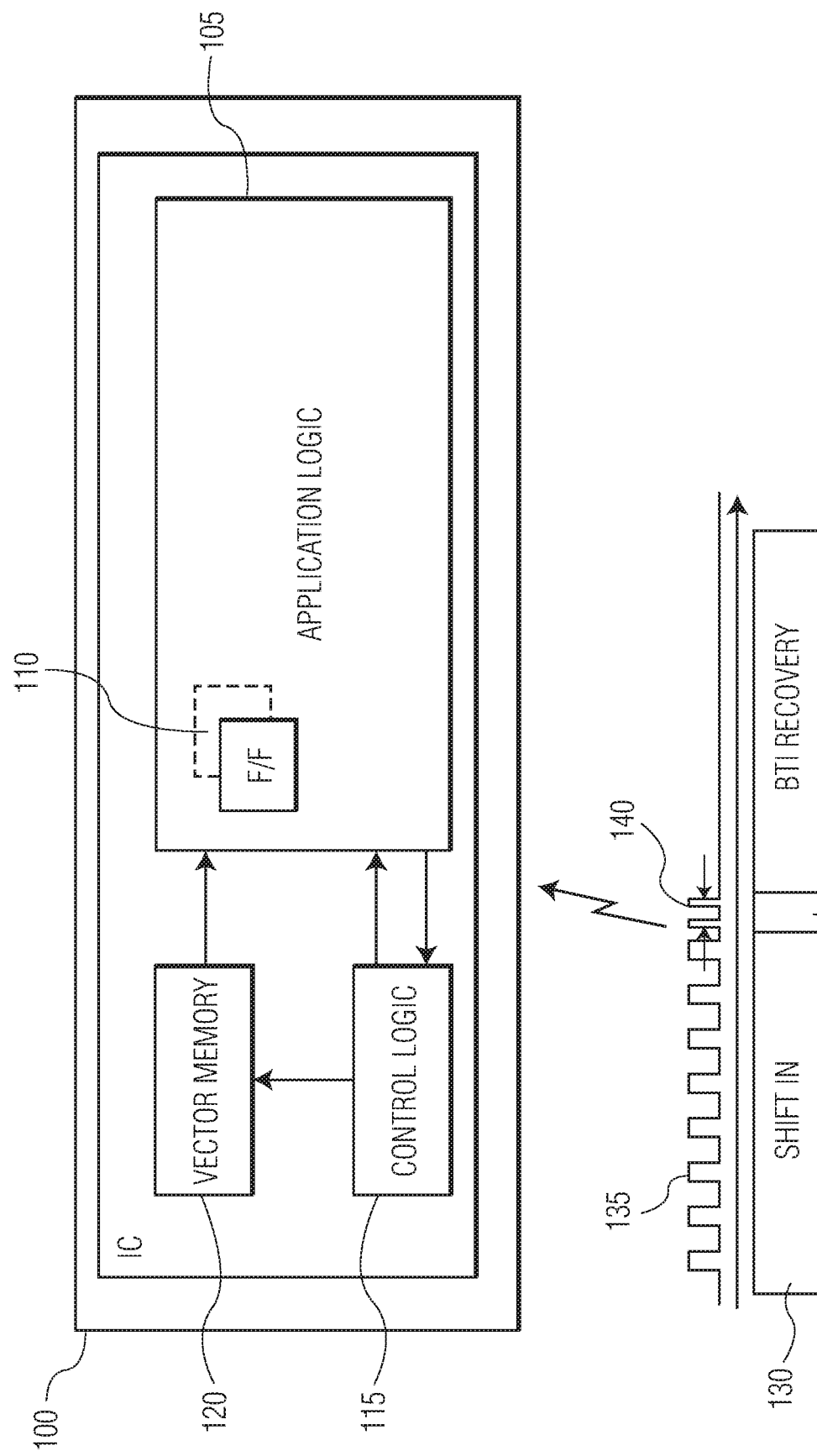
FIG. 1A is a combined block diagram and timing diagram, in accordance with the present disclosure illustrating an apparatus including an example integrated circuit and associated timing for the integrated circuit.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving the processing of data in logic circuitry such as flip-flops, in response to a clock signal, for at least mitigating if not overcoming adverse changes in the setup/hold times of such circuitry as may occur in connection with Bias Temperature Instability (BTI) as such circuitry ages. In certain implementations, aspects of the present disclosure have been shown to be beneficial when used to address such issues specifically in flip-flop circuits when the BTI-related issues change the actual setup-hold times relative to the clocking margins specified for each such flip-flop (e.g., by the IC-designer/manufacturer). While not necessarily so limited, various aspects may be appreciated through the following discussion of non-limiting examples which use exemplary contexts benefiting the timing of involving of flip-flops so that their input/output (I/O) data is adequately stable, despite such BTI or aging-related degradations, for the specified minimum times relative to the clock edges used to process data through the flip-flops.

Accordingly, in the following description various specific details are set forth to describe apparatuses, of various types (e.g., appliances, vehicle electronics, etc.), including specific examples of circuits carrying out and/or benefiting from aspects and features of the present disclosure. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination. It will also be appreciated that terms to exemplify orientation (e.g., left/right, top/bottom and above/below), may be used herein to refer to relative positions of depictions in the examples (solely for notational convenience) and that in actual use different orientation may be used.

In some examples, illustrative embodiments are directed to integrated circuitry or an IC (e.g., as a single chip or multiple chips engineered to operate in cooperation) having flip-flop circuits which have adversely changed/changing setup/hold times for signals to be processed by one or more of the flip-flop circuits. In such examples, the IC carries out certain steps or actions on chip), by using circuitry in the IC to control timing-based logic states of the flip-flop circuits based on at least one transition-scan pattern processed by the flip-flop circuits as part of the application logic circuitry. In connection with these steps or actions, respective logic states of the flip-flop circuits are set for those flip-flops for which degradations of the actual setup and hold times do not satisfy the originally specified minimum setup and hold times.

Using such above-described aspects and features, other specific example embodiments are directed to apparatuses/methods in which the flip-flop circuits are susceptible to these degradations of setup and hold times as they approach or surpass the minimum setup and hold times for signals as specified by the circuit designers/manufacturers. As such aspects and actions may be carried out on-chip, these aspects/features may include the control circuitry controlling timing-based logic states of the flip-flop circuits based on a transition-scan pattern processed by the flip-flop circuits as part of the application logic circuitry, and may also set respective logic states of the flip-flop circuits for which the degradations of the actual setup and hold times do not satisfy the originally specified minimum setup and hold times.

In more specific examples directed to the above apparatuses, the control logic is configured to assess whether to set respective ones of the flip-flop circuits to the opposing one of two logic states, as a constant logic state, during times when the flip-flop circuits are inactive, and/or to assess whether historically respective ones of the flip-flop circuits are likely to have been set predominantly in one of the two logic states and, in response, to set said respective ones of the flip-flop circuits to the other one of the two logic states, as a constant logic state, during times when the flip-flop circuits are inactive.

In further specific examples directed to the above apparatuses, the application logic circuitry is configured to operate at an application clock frequency. Optionally, this operation may be associated with the control circuitry testing the application logic circuitry while using a clock frequency slightly above (e.g., in a range 2-10% or 11-20% greater than) the application clock frequency, and in response, assessing whether to set respective ones of the flip-flop circuits to the opposing one of two logic states, as a constant logic state, during times when the flip-flop circuits are inactive.

In certain other examples, such apparatuses and methods may configure the application logic circuitry so that it operates at an application clock frequency, and with the control circuitry being configured to test the application logic circuitry while using a clock frequency slightly above the application clock frequency (as might be set per the above example ranges) to determine that respective ones of the flip-flop circuits are susceptible to failures relative to the setup/hold time margins, and respond by setting the respective ones of the flip-flop circuits in appropriate logic states, as constant logic states, during times when the flip-flop circuits are inactive.

In yet further specific examples, such apparatuses and methods may be carried out post-manufacture and on chip, such as in the field upon and/or after initial installation. The integrated circuit may include scan-pattern test circuitry for testing the application logic circuitry, when the flip-flop circuits are inactive, at a clock frequency at a rate slightly above a clock frequency normally used by the application logic circuitry. The scan-pattern test circuitry may be then used to provide, at different occurrences post-manufacture, at least one test vector to the application logic to assess whether the control circuitry is to set respective ones of the flip-flop circuits to the opposing one of two logic states, as a constant logic state, during times when the flip-flop circuits are inactive.

In more specific examples of such apparatuses and methods, the application logic circuitry operates at an application clock frequency, and wherein the control circuit is to test the application logic circuitry while using a clock frequency slightly above the application clock frequency and using timing estimates of data and clock paths (e.g., derived from the testing) to alter operability of one of the flip-flop circuits and by causing advancement of a data edge, relative to a clock edge, of said one of the flip-flop circuits. Also, the control circuit may be configured to test the application logic circuitry while using a clock frequency at a rate slightly above an application clock frequency used for the application logic circuitry and using timing estimates of data and clock paths from the testing to alter operability of one of the flip-flop circuits by causing delay of a data edge, relative to a clock edge, of said one of the flip-flop circuits.

According to specific applications of such circuits, the control and related timings of the flip-flops are controlled to address BTI having affected, by either advancing or delaying the data edge relative to the clock edge at the inputs of a flip-flop, and/or by adversely impacting the timing behavior of the flip-flops themselves which may more directly modify the required minimum setup and hold times. In some instances, the impact of BTI on a flip-flop's minimum setup and hold times has been found to depend on the history of the flip-flop's logic state. As an example, if the history shows that the logic state was in 0-state for a long time, then the minimum setup time decreases and the minimum hold time increases, whereas if it was in 1-state for a long time, then the minimum setup time increases and the minimum hold time decreases. By addressing these adverse changes (e.g., on chip), certain of the examples disclosed herein show how a greater tolerance/immunity to process variations, allowing for smaller, faster ICs with lower failure rate in the field. While not necessarily applicable to each of the embodiments illustrated/disclosed for addressing such BTI-related issues, certain of the embodiments in accordance with the present disclosure show control circuitry to control timing-based logic states of the flip-flop circuits based on one or more transition-scan patterns processed by the flip-flop circuits. These scan patterns may be used to set respective logic states of the flip-flop circuits for which degradations of the actual setup and hold times do not satisfy the originally specified minimum setup and hold times.

Consistent with certain of the features and aspects described above, FIG. 1A shows a block diagram of an apparatus 100, which may be any of various systems, appliances or devices, having an integrated circuit 100 with application logic circuitry 105 including flip-flop circuits 110 which may be deemed susceptible to degradations of setup and hold times relative to specified minimum setup and hold times for signals to be processed by the respective flip-flop circuits. In certain embodiments, aspects of the present disclosure exploit the impact of BTI to flip-flop clock timing, by adjusting the flip-flops' minimum setup and hold times to mitigate/prevent the situation that they no longer satisfy the setup-time and hold-time criteria specified for the arriving signal. In certain examples, this is realized by setting the flip-flop to a constant state, the state being set to a logic 0 if the minimum setup time is too high, and the state being set to a logic 1 if the minimum setup time is too high. The flip-flops may be left in this state for a longer time interval, e.g., during sleep mode or idle phases.

Various circuits may be used to set the flip-flop to a constant state. As in FIG. 1A, on-chip circuitry such as control logic 115 and vector memory 120 may be employed in this regard based on a selected transition scan pattern (e.g., stored in the vector memory 120), and with the scan pattern being applied via the control logic 115 for processing in the application logic circuitry 105 (including the flip-flop circuits 110) at a clock frequency which is slightly above the application frequency.

Figure 1B:
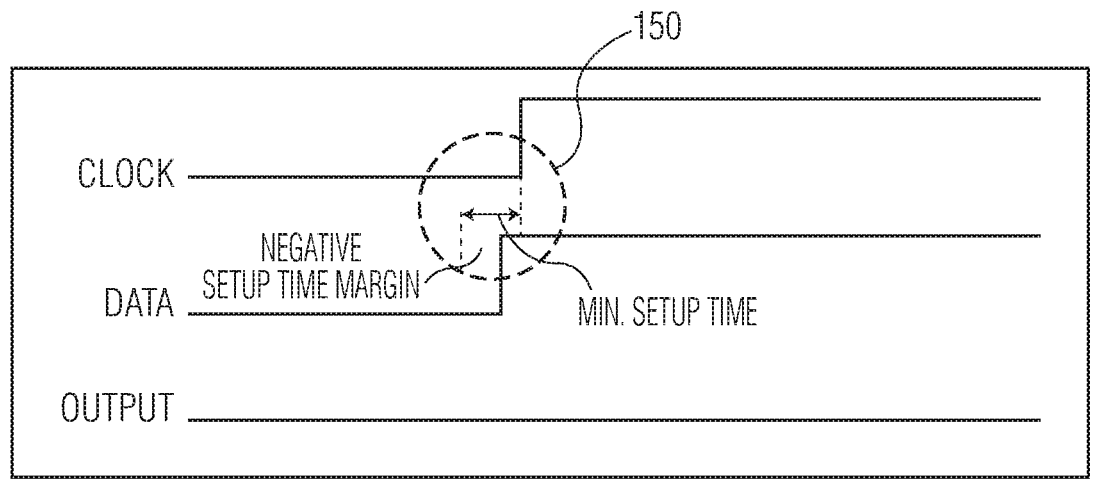
FIGS. 1B and 1C are hypothetical timing diagrams, for aspects in accordance with the present disclosure, respectively illustrating setup times being lower and higher than specified minimum setup times for the example integrated circuit of FIG. 1A.

FIG. 1B is used to illustrate timing associated with such a transition scan pattern stored in and provided from vector memory 120, and in connection with an example transition-scan test method in accordance with the present disclosure, with the data vector/pattern 130 being shifted into the application logic circuitry 105 via an application clock frequency 135 (such as at I/O ports of the application logic circuitry 105). The method may be used to test if the propagation delay of all data paths is sufficiently low to ensure stable operation of the application logic circuitry 105 at the application frequency. The method therefore targets setup violations at the flip-flops at the end of the data paths. The clock used for the application frequency may be created by an internal phase-locked loop (not shown) as is conventional in ICs having on-chip scan-test circuitry. In certain example methods along this line, the clock frequency is chosen to be equal to the application frequency or it is chosen to be slightly higher. In the latter case, the test is passing only if the flip-flop's minimum setup time has some additional margin with respect to the application clock frequency. Such a transition test may be referred to as transition-at-overspeed.

In certain examples relating to this above methodology, transition scan testing may use several scan patterns, each covering different data paths. The patterns may be shifted into the scan chain, and then a capture mode is executed as depicted at capture cycle 135 and having two clock edges for application in a short time interval, corresponding to the application clock cycles. In certain more specific examples such as in the case of production scan test, the pattern may be shifted out after the capture cycle and compared to expected values by a production tester. In other specific examples, however, such comparison is not performed and, instead, the flip-flops are left in the state they took after being in the capture cycle.

In connection with the data vector/pattern 130, FIG. 1A shows exemplary timing for the purpose of creating and using a BTI recovery vector (as opposed to the timing being applied in a production scan test). In the capture cycle 135, the scan test timing has two clock edges of the application clock frequency, as depicted between arrows at 140.

In certain examples, the transition-at-overspeed pattern for BTI recovery may be used for setting the states of the scan flip-flops (as opposed to being used for getting a pass/fail decision), such that these states are the states required for BTI recovery. The circuitry may then leave the flip-flops in their state for some time in order to perform BTI recovery. In other examples, a related method may be used for getting a pass/fail decision associated with the minimum setup/hold times of one or more of the flip-flops and then use (e.g., as an option) this decision for setting the states of the flip-flop(s). In the former case, this pattern is paused after the second capture mode clock cycle. The states of the flip-flops are hence not shifted out (as would be the case in a transition scan test), but are kept in the scan flip-flops. There is hence no "pass" or "fail" in the sense of a comparison by a production tester.

Accordingly, in certain example ICs incorporating such methodology, two outcomes are possible for each flip-flop. One outcome occurs when a flip-flop's minimum setup time is sufficient for transition-at-overspeed pattern, in which case the flip-flop changes to a 1 state. This corresponds to the full setup time margin being available (i.e., the margin between "overspeed" and "application speed"). The setup time margin is hence higher than required for the application, and the hold time margin may be too small. As the flip-flop state is 0, BTI would increase the minimum setup time of the flip-flop, and decrease the minimum hold time.

Another outcome occurs when a flip-flop's setup time is too small for transition-at-overspeed, in which case the flip-flop state does not change and hence maintains its 0 state. This corresponds to a situation in which the setup time margin to application speed is likely still positive, but too small to ensure safe operation. As the flip-flop state is 0, BTI will decrease the minimum setup time of the flip-flop, and increase the minimum hold time.

In these examples discussed in connection with FIG. 1A, the control logic circuit 115 may take over the control over the application logic either once the application logic is in idle mode, or before the IC is powered down (e.g., by the user). The control logic applies the scan mode to the application logic and then applies the transition pattern stored in the vector memory 120. It then waits for a certain time, e.g. some seconds, as needed per the testing for addressing the BTI-related changes.

Consistent with the above discussed aspects, another aspect concerns an example scheduling approach for executing such methodology. For example, once the application logic goes to an idle state (e.g., is switched off, goes to stand-by mode, etc.), a transition-at-overspeed pattern is executed and stopped after the capture mode, thereby maintaining the flip-flops in their respective states of this capture mode. Then, a certain time of BTI recovery is applied, keeping the logic powered on. After finishing the recovery phase, the application logic goes back to idle application mode (or, on request, is powered down). Also, the recovery phase can be immediately stopped by a wake-up, if the application logic is needed.

In certain other examples, transition scan patterns may attempt to test both the transitions of logic 0 to logic 1 (0→1) and of logic 1 to logic 0 at each flip-flop's data input. This is because either of the transitions could be too slow, either due to a manufacturing defect, or due to parametric deviations. In a specific example, the applicable circuitry uses only one of these transitions, namely the 0→1 transition, and the creation of the transition scan patterns that cause predominantly 0→1 transitions can be facilitated by providing the required parameters to the scan pattern creation software.

In yet another example, a small-delay-defect-transition scan test may be applied to use mainly transition scan test patterns which are most critical in terms of timing. Thus, this approach may be used to activate data paths with the lowest setup timing margin at the receiving flip-flop(s). Small-delay-defect transition scan test patterns may be created via a scan pattern creation software program (e.g., executed by a CPU or other circuit-based tool) that reads in the timing information of all relevant propagation delays for all data paths and all clock paths in the application logic circuit (e.g., 105 of FIG. 1A) in the worst-case scenarios such as burdensome processes such as based on slow timing (e.g., "slowest process corner") and low supply voltages. These delays may be given in the .sdf (standard delay format) file, which is created in the course of creating a post-layout netlist for later use in connection with the transition scan test pattern testing.

Figure 1C:
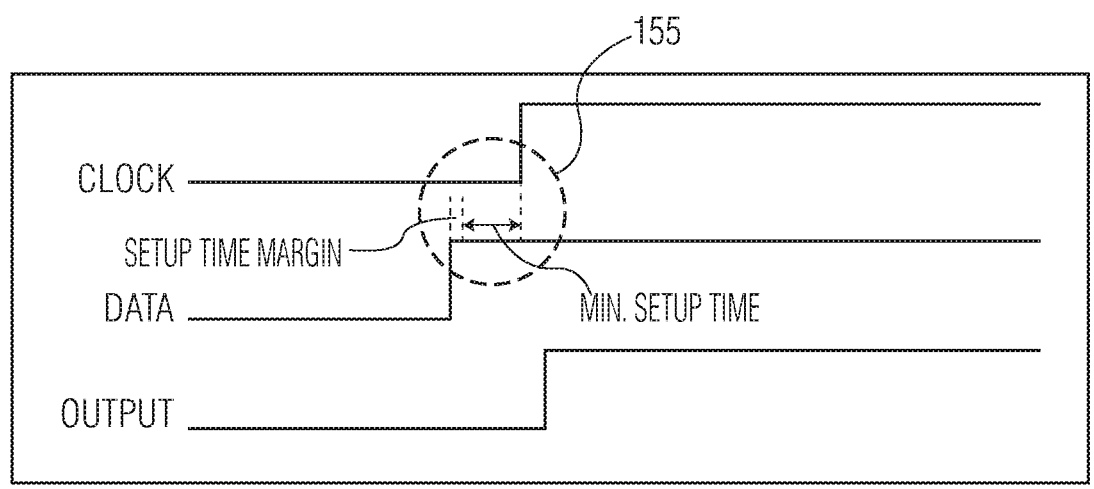

In accordance with aspects of the present disclosure, FIGS. 1B and 1C show hypothetical timing diagrams, respectively, for illustrating setup times being lower and higher than specified minimum setup times as may be applicable for the example IC of FIG. 1A. More specifically, the timings of these figures are associated with examples in which an on-chip-created recovery vector is used for adjusting the minimum setup/hold times for a flip-flop 110 in the application logic circuitry 105. For a dedicated vector, as may be stored in the vector memory 120, applied to the flip-flop, the timing is chosen to be slightly more critical than the worst-case application timing. In this regard, the clock frequency is slightly higher than the application clock frequency. FIG. 1B shows the case where the minimum setup time of the flip-flop is higher than the actual setup time, as depicted at 150; in this case, a setup violation would occur. When the clock frequency is higher than the application clock frequency, this indicates that the setup timing margin is too low. Due to this violation of the setup time minimum, the data are not processed and taken over correctly. The flip-flop then stays in the 0-state where BTI decreases the minimum setup time (this is required to recover a sufficient margin to prevent such setup violations); it increases the minimum hold time (this is tolerated in such cases because the hold time then has some margin).

FIG. 1C shows the case where the minimum setup time of the flip-flop is lower than the actual setup time, as depicted at 155. Hence the data are taken over correctly. The flip-flop then stays in the state where BTI decreases the minimum hold time (this may be required in certain instances); it increases the minimum setup time (this may be tolerated as the setup time has some margin). Having no setup violation does not directly indicate a violation of hold time, but it indicates that it is safe to increase the minimum setup time in order to reduce the minimum hold time.

Figure 2A:
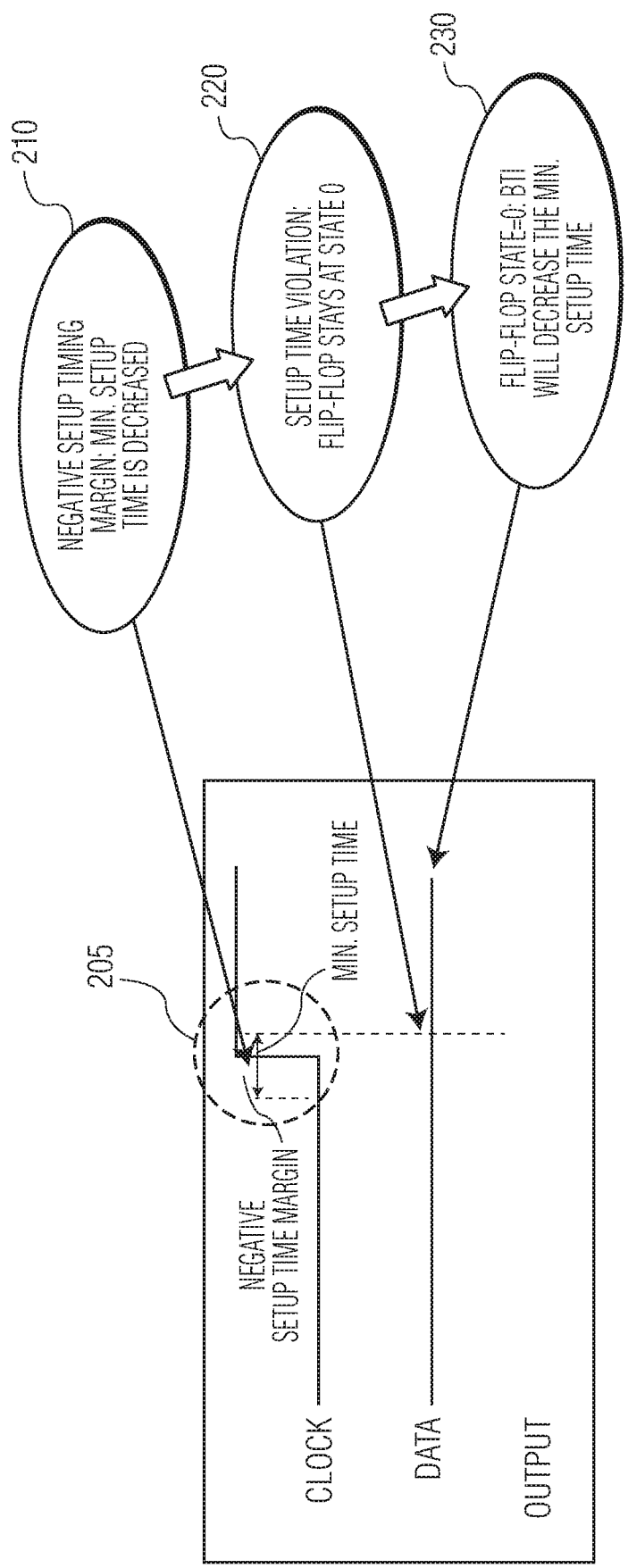
FIGS. 2A and 2B are flow charts associated with illustrated timing, also in accordance with the present disclosure, showing example sets of steps/actions that may be taken for addressing situations corresponding to the hypothetical timing diagrams of FIGS. 1B and 1C.
Figure 2B:
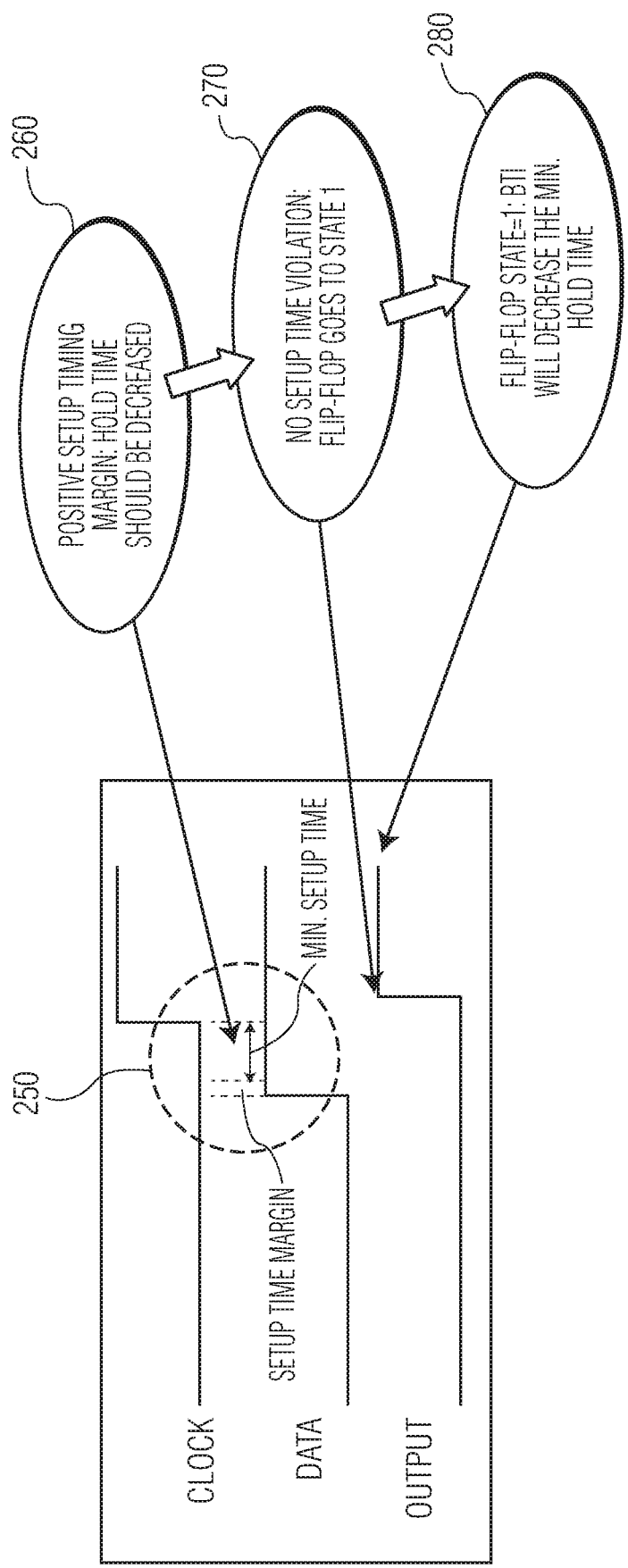

FIGS. 2A and 2B illustrated exemplary flow which may be used in connection with the illustrated timing for the cases shown by way of FIGS. 1B and 1C. As above, in certain examples, to adjust the flip-flops' minimum setup and hold times in case they do not meet the setup and hold times of the arriving signal anymore, the flip-flop(s) may be set to a constant state. The state may be set to 0 if the minimum setup time is too high, and the state may be set to 1 if the minimum hold time is too high, with the flip-flop(s) being left in such state for a longer time interval, e.g. during sleep mode or idle phases. This may be done based on a selected transition scan pattern at a clock frequency slightly above the application frequency.

FIG. 2A illustrates the flow for the case where the flip-flop's minimum setup time is too high, as depicted at 205. This illustration corresponds to negative setup timing margin, where the minimum setup time is to be decreased, as at 210. Hence the flip-flop stays at state 0 (the state in which BTI decreases the minimum setup time). From 205 of FIG. 2A, flow proceeds to 220 which corresponds to a setup time violation in which instance the flip-flop stays at state 0. From 220, flow proceeds to 230 which corresponds to keeping the flip-flop at a state of logic 0.

FIG. 2b illustrates the flow for the case where the flip-flop's minimum setup time is too low, as depicted at 250. This illustration shows that the hold time might be too high, in which case the flip-flop goes to state 1 (where BTI decreases the minimum hold time). Accordingly, at 260 the circuitry recognizes that for this positive setup timing margin, hold time should be decreased. From 260, flow proceeds to 270 which corresponds to there being no setup time violation in which instance the flip-flop goes to state 1. From 270, flow proceeds to 280 which corresponds to keeping the flip-flop at the state of logic 1.

Consistent with the above example flows, certain of these methods may provide for adequate self-adjusting that can be executed in the field on-chip without needing any hardware overhead or computation capacity. Advantageously, this allows for ICs of this type having less strict design margins, and permitting for higher setup and hold timing margins in the field where these ICs are used. In turn, these advantages may yield reductions in failure rates, aging, and sensitivity to single event upsets and cross-talk.

The present disclosure recognizes that in other situations, IC-test equipment might be used (e.g., as alternatives to the circuits 115 and 120 of FIG. 1A) to carry out related methods involving such illustrated flows.

This allows for less strict design margins, and leads to higher setup and hold timing margins in the field, hence reducing failure rates, aging, and sensitivity to single event upsets and cross-talk.

Figure 3:
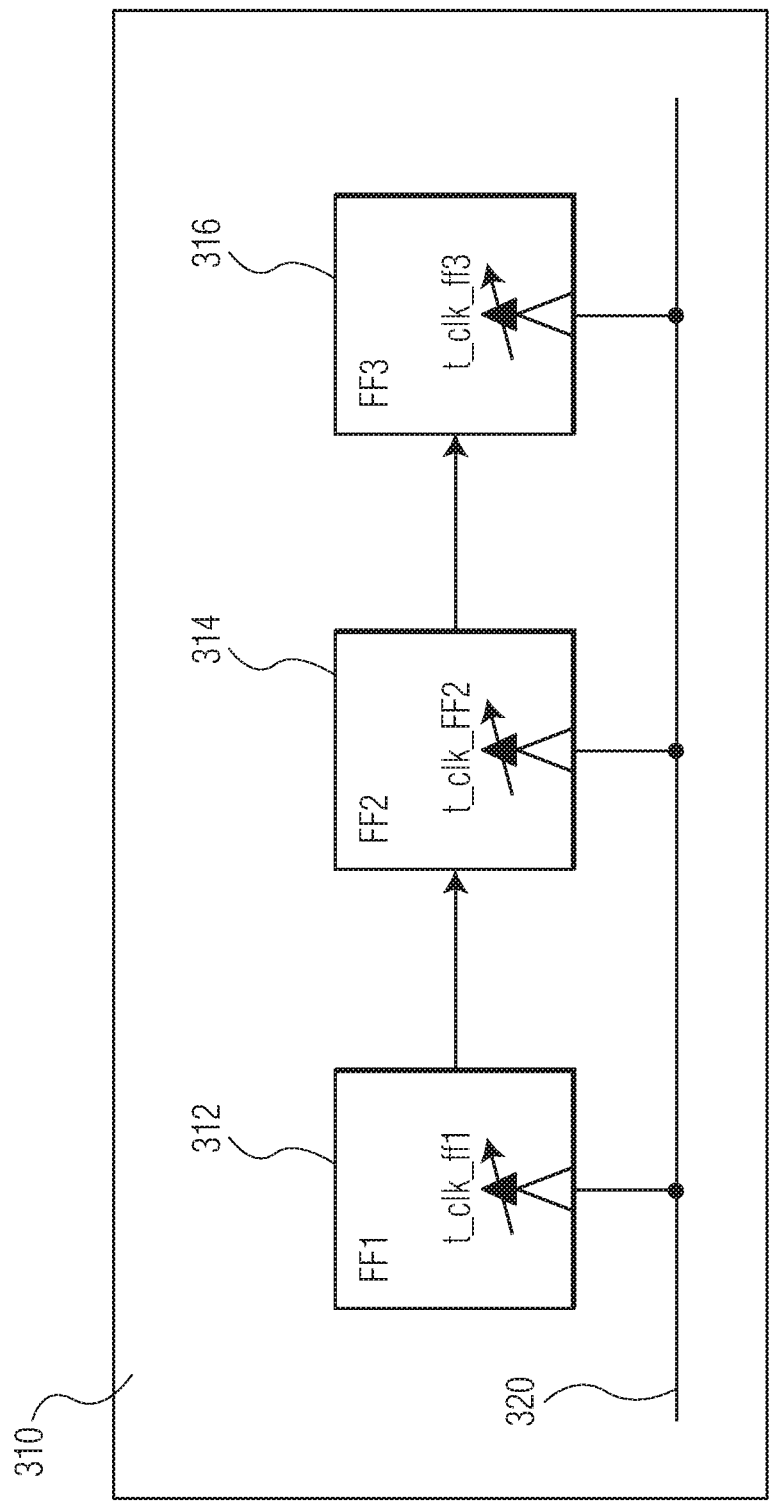
FIG. 3 is a block diagram, also for aspects in accordance with the present disclosure, illustrating clocking timing issues of a plurality of flip-flops connected in series, such as may occur for exemplary logic circuitry as shown in the example IC of FIG. 1A.

FIG. 3 is a block diagram illustrating clocking timing issues with an example of flip-flop circuitry 310, as may be applied such as with 110 of FIG. 1A, for which multiple flip-flops are connected in series. In this instance, the flip-flop circuitry 310 includes three cascaded D-type flip-flops 312, 314 and 316, each being triggered by an edge of a clock signal 320 at a respective one of the clock-input terminals. The effort of adjusting the flip-flop timing for compensating the BTI effect on the flip-flop timing itself, and on the timing of clock and data paths, may be challenging, because most flip-flops are defining both the beginning and end points of their respective data paths. As shown in FIG. 3 by the connection of the flip-flops 312, 314 and 316, a common data path is shared from flip-flop 312 through flip-flop 314 to flip-flop 316, another path is from flip-flop 312 to flip-flop 314, and another data path is formed from flip-flop 314 to flip-flop 316. By advancing or delaying the clock signal for one of these flip-flops, as exemplified by changing the t clk FF2 value of flip-flop 314, this changes not only the setup and hold times of flip-flop 314 itself, but this also changes the timing of the output from flip-flop 314. Hence, the data path from flip-flop 314 to flip-flop 316 is also affected. In many ICs, the interdependencies are of course much more complex because, as exemplified here, data paths have several roots and several end points. While complex situations of this type can be challenging, in accordance with the aspects of the present disclosure, mitigation of such BTI issues may be readily achieved.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depict such blocks (modules) as described herein (e.g., as in FIG. 1A and as with 310 of FIG. 3). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in connection with FIGS. 2A and 2B. In certain embodiments, such a programmable circuit is one or more computer circuits, including memory circuitry for storing and accessing a program to be executed as a set (or sets) of instructions (and/or to be used as configuration data to define how the programmable circuit is to perform), and an example algorithm/process (e.g., relating to the actions/steps such as with FIGS. 2A and 2B) is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as circuit, IC and/or chip-set, the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps; and such steps/actions might involve other complementary/alternative embodiments including, for example, using empirical data (along with or instead of) data developed in the field from scan test patterns to ascertain that the setup/hold times of the logic/flip-flop circuitry would benefit from a change.

Such modifications do not depart from the true spirit and scope of various aspects of the disclosure, including aspects set forth in the claims

What is claimed is:

1. In an integrated circuit having application logic circuitry which includes flip-flop circuits susceptible to degradations of setup and hold times relative to specified minimum setup and hold times for signals to be processed by the respective flip-flop circuits, a method carried out by the integrated circuit and comprising:

controlling timing-based logic states of the flip-flop circuits based on at least one transition-scan pattern processed by the flip-flop circuits as part of the application logic circuitry; and setting respective logic states of the flip-flop circuits in instances where due to degradations, actual setup and hold times do not satisfy criteria for the specified minimum setup and hold times.

2. The method of claim 1, further including assessing whether to set respective ones of the flip-flop circuits to an opposing one of two logic states, as a constant logic state, during times when the flip-flop circuits are inactive.

3. The method of claim 1, further including assessing whether historically respective ones of the flip-flop circuits are likely to have been set predominantly in one of the two logic states and, in response, setting said respective ones of the flip-flop circuits to another one of the two logic states, as a constant logic state, during times when the flip-flop circuits are inactive.

4. The method of claim 1, wherein the application logic circuitry operates at an application clock frequency, and further including operating the application logic circuitry while using a clock frequency slightly above the application clock frequency, and in response assessing whether to set respective ones of the flip-flop circuits to the opposing one of two logic states, as a constant logic state, during times when the flip-flop circuits are inactive.

5. The method of claim 1, wherein the application logic circuitry operates at an application clock frequency, and further including testing the application logic circuitry while using a clock frequency slightly above the application clock frequency to determine that respective ones of the flip-flop circuits are susceptible to failures relating to setup and/or hold time margins, and in response, setting the respective ones of the flip-flop circuits in appropriate logic states, as constant logic states, during times when the flip-flop circuits are inactive.

6. The method of claim 1, wherein the integrated circuit includes scan-pattern test circuitry to operate the application logic circuitry, when the flip-flop circuits are inactive, at a clock frequency slightly above a clock frequency normally used by the application logic circuitry, and further including using the scan-pattern test circuitry at different occurrences post-manufacture to assess whether to set respective ones of the flip-flop circuits to the opposing one of two logic states, as a constant logic state, during times when the flip-flop circuits are inactive.

7. The method of claim 1, wherein the integrated circuit includes scan-pattern test circuitry to operate the application logic circuitry, and further including, at different times in post-manufacture use, automatically detecting that the application logic circuitry is inactive and in response operating the application logic circuitry by using a clock frequency slightly above a clock frequency normally used by the application logic circuitry and by causing the application logic circuitry to process a scan-pattern to assess whether to set respective ones of the flip-flop circuits to certain constant logic states.

8. The method of claim 1, wherein the application logic circuitry operates at an application clock frequency, and further including testing the application logic circuitry while using a clock frequency slightly above the application clock frequency and using timing estimates of data and clock paths from the testing to alter operability of one of the flip-flop circuits by causing advancement of a data edge, relative to a clock edge, of said one of the flip-flop circuits.

9. The method of claim 1, wherein the application logic circuitry operates at an application clock frequency, and further including testing the application logic circuitry while using a clock frequency slightly above the application clock frequency and using timing estimates of data and clock paths from the testing to alter operability of one of the flip-flop circuits by causing delay of an input data edge, relative to a clock edge, of said one of the flip-flop circuits.

10. The method of claim 1, wherein the degradations have been influenced at least in part due to bias temperature instability.

11. An apparatus comprising:
application logic circuitry including flip-flop circuits susceptible to degradations of setup and hold times relative to specified minimum setup and hold times for signals to be processed by the respective flip-flop circuits; and
control circuitry to control timing-based logic states of the flip-flop circuits based on at least one transition-scan pattern processed by the flip-flop circuits as part of the application logic circuitry, and to set logic states of the flip-flop circuits in instances where due to degradations, actual setup and hold times do not satisfy criteria for the specified minimum setup and hold times.

12. The apparatus of claim 11, wherein the control logic is to assess whether to set respective ones of the flip-flop circuits to an opposing one of two logic states, as a constant logic state, during times when the flip-flop circuits are inactive.

13. The apparatus of claim 11, wherein the control circuitry is to assess whether historically respective ones of the flip-flop circuits are likely to have been set predominantly in one of the two logic states and, in response, to set said respective ones of the flip-flop circuits to another one of the two logic states, as a constant logic state, during times when the flip-flop circuits are inactive.

14. The apparatus of claim 11, wherein the application logic circuitry is to operate at an application clock frequency, and wherein the control circuitry is to test the application logic circuitry while using a clock frequency slightly above the application clock frequency, and in response to assess whether to set respective ones of the flip-flop circuits to the opposing one of two logic states, as a constant logic state, during times when the flip-flop circuits are inactive.

15. The apparatus of claim 11, wherein the application logic circuitry is to operate at an application clock frequency, and wherein the control circuitry is to operate the application logic circuitry while using a clock frequency slightly above the application clock frequency to determine that respective ones of the flip-flop circuits are susceptible to failures relating to setup/hold time margins, and in response, setting the respective ones of the flip-flop circuits in appropriate logic states, as constant logic states, during times when the flip-flop circuits are inactive.

16. The apparatus of claim 11, wherein the integrated circuit includes scan-pattern test circuitry to test the application logic circuitry, when the flip-flop circuits are inactive, at a clock frequency slightly above a clock frequency normally used by the application logic circuitry, and wherein using the scan-pattern test circuitry is to provide, at different occurrences post-manufacture, at least one test vector to the application logic to assess whether the control circuitry is to set respective ones of the flip-flop circuits to the opposing one of two logic states, as a constant logic state, during times when the flip-flop circuits are inactive.

17. The apparatus of claim 11, wherein the control circuitry includes scan-pattern test circuitry to test the application logic circuitry, and further including, at different times in post-manufacture use, automatically detecting that the application logic circuitry is inactive and in response testing the application logic circuitry by using a clock frequency at a rate slightly above a clock frequency normally used by the application logic circuitry and by causing the application logic circuitry to process a scan-pattern to assess whether to set respective ones of the flip-flop circuits to certain constant logic states.

18. The apparatus of claim 11, wherein the application logic circuitry is to operate at an application clock frequency, and wherein the control circuit is to test the application logic circuitry while using a clock frequency slightly above the application clock frequency and using timing estimates of data and clock paths from the testing to alter operability of one of the flip-flop circuits by causing advancement of a data edge, relative to a clock edge, of said one of the flip-flop circuits.

19. The apparatus of claim 11, wherein the application logic circuitry is to operate at an application clock frequency, and where the control circuit is to test the application logic circuitry while using a clock frequency slightly above the application clock frequency and using timing estimates of data and clock paths from the testing to alter operability of one of the flip-flop circuits by causing delay of a data edge, relative to a clock edge, of said one of the flip-flop circuits.

20. The apparatus of claim 11, including a circuit integrated as a single chip or a set of multiple chips, wherein the application logic circuitry and the control circuit are part of the integrated circuit, and wherein the control circuit includes vector memory to store at least one scan-test pattern which is to be processed by the application logic circuitry when the application logic circuitry is otherwise inactive, and further includes control logic to assess, in response to the application logic circuitry processing the at least one scan-test pattern, whether to set respective ones of the flip-flop circuits to certain constant logic states for mitigating adverse effects attributable at least in part to bias temperature instability and certain of the flip-flop circuits having been set predominantly in one of two logic states.

* * * * *